(12) United States Patent
Ichikawa et al.

(10) Patent No.: US 11,721,756 B2
(45) Date of Patent: Aug. 8, 2023

(54) SEMICONDUCTOR DEVICE

(71) Applicant: FUJI ELECTRIC CO., LTD., Kawasaki (JP)

(72) Inventors: Yoshihito Ichikawa, Matsumoto (JP); Akimasa Kinoshita, Matsumoto (JP); Shingo Hayashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 77 days.

(21) Appl. No.: 17/358,984

(22) Filed: Jun. 25, 2021

(65) Prior Publication Data
US 2022/0069120 A1 Mar. 3, 2022

(30) Foreign Application Priority Data
Aug. 25, 2020 (JP) .................. 2020-142055

(51) Int. Cl.
*H01L 29/78* (2006.01)
*H01L 29/16* (2006.01)

(52) U.S. Cl.
CPC ...... *H01L 29/7813* (2013.01); *H01L 29/1608* (2013.01)

(58) Field of Classification Search
CPC ............. H01L 29/7813; H01L 29/1608; H01L 29/0623; H01L 29/0696; H01L 29/0878; H01L 29/1095; H01L 29/66068; H01L 29/7805; H01L 29/7375; H01L 29/7397; H01L 29/66333–66348; H01L 29/66325–66348; H01L 29/7393–7398; H01L 2924/13055; H01L 29/083–0839; H01L 27/0617–0635; H01L 27/0705–0738; H01L 27/088–0883
See application file for complete search history.

(56) References Cited

U.S. PATENT DOCUMENTS

| 2018/0033885 A1 | 2/2018 | Okumura et al. |
| 2018/0204905 A1* | 7/2018 | Ohse ................. H01L 29/66068 |
| 2018/0294350 A1 | 10/2018 | Utsumi et al. |

FOREIGN PATENT DOCUMENTS

| JP | 2018-019045 A | 2/2018 |
| JP | 2018-182032 A | 11/2018 |

* cited by examiner

*Primary Examiner* — Cuong B Nguyen
(74) *Attorney, Agent, or Firm* — Rabin & Berdo, P.C.

(57) ABSTRACT

A semiconductor device includes a semiconductor substrate of a first conductivity type, a first semiconductor layer of the first conductivity type, first base regions of a second conductivity type, second base regions of the second conductivity type, a second semiconductor layer of the second conductivity type, first semiconductor regions of the first conductivity type, second semiconductor regions of the second conductivity type, gate insulating films, gate electrodes, an interlayer insulating film, first electrodes, a second electrode, and trenches. Between adjacent first base regions, at least two of the trenches, at least two of the gate electrodes, and at least two of the second base regions are disposed, the second base regions disposed between the adjacent first base regions being disposed separate from one another and separate from the first base regions, in a direction in which the trenches are arranged.

7 Claims, 6 Drawing Sheets

SEMICONDUCTOR DEVICE

CROSS REFERENCE TO RELATED APPLICATIONS

This application is based upon and claims the benefit of priority of the prior Japanese Patent Application No. 2020-142055, filed on Aug. 25, 2020, the entire contents of which are incorporated herein by reference.

BACKGROUND OF THE INVENTION

1. Field of the Invention

Embodiments of the invention relate to a semiconductor device.

2. Description of the Related Art

As a power semiconductor device, metal oxide semiconductor field effect transistors (MOSFETs) are commonly known. In particular, compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. Therefore, SiC-MOSFETs are used in power converting circuits of inverters, converters, etc. Reduced loss, high efficiency, and improved reliability are demanded of these power semiconductor devices.

Among power semiconductor devices, a vertical SiC-MOSFET having a trench structure for reducing device element ON resistance is fabricated (manufactured) (for example, refer to Japanese Laid-Open Patent Publication No. 2018-182032). As compared to a planar structure in which a channel is formed parallel to a substrate surface, in a vertical MOSFET, the trench structure in which a channel is formed orthogonal to a substrate surface enables unit cell (constituent unit of a device element) density per unit area to be increased and enables current density per unit area to be increased, which are advantageous in terms of cost.

A structure of a conventional silicon carbide semiconductor device is described taking a trench-type MOSFET as an example. FIG. 8 is a cross-sectional view depicting a structure of a conventional silicon carbide semiconductor device. As depicted in FIG. 8, in a trench-type MOSFET 150, an n$^-$-type silicon carbide epitaxial layer 102 is deposited on a front surface of an n$^+$-type silicon carbide substrate 101. At a first surface of the n$^-$-type silicon carbide epitaxial layer 102 opposite to a second surface thereof facing the n$^+$-type silicon carbide substrate 101, an n-type high-concentration region 105 is provided. Further, in the n-type high-concentration region 105, at a first surface thereof opposite to a second surface thereof facing the n$^+$-type silicon carbide substrate 101, first p$^+$-type base regions 103 are selectively provided. In the n-type high-concentration region 105, second p$^+$-type base regions 104 are selectively provided so as to respectively underlie entire areas of bottoms of trenches 115.

Further, in the trench-type MOSFET 150, a p-type base layer 106, n$^+$-type source regions 107, p$^{++}$-type contact regions 108, gate insulating films 109, gate electrodes 113, an interlayer insulating film 110, source electrodes 116, a back electrode 111, the trenches 115, a source electrode pad (not depicted), and a drain electrode (not depicted) are further provided. The source electrodes 116 are provided on the n$^+$-type source regions 107 and the p$^{++}$-type contact regions 108, and the source electrode pad is provided on the source electrodes 116.

In the vertical MOSFET with such a configuration, a parasitic pn diode formed by the p-type base layer 106 and the n$^-$-type silicon carbide epitaxial layer 102 is built therein as a body diode between a source and drain. The parasitic pn diode may be caused to operate by an application of high potential to the source electrodes 116, and current flows in a direction from the p$^{++}$-type contact regions 108, through the p-type base layer 106 and the n$^-$-type silicon carbide epitaxial layer 102, to the n$^+$-type silicon carbide substrate 101. In this manner, in the MOSFET, unlike in an insulated gate bipolar transistor (IGBT), a parasitic pn diode is built-in, whereby a freewheeling diode (FWD) used in an inverter may be omitted, thereby contributing to reductions in cost and size. Hereinafter, a parasitic pn diode of a MOSFET is referred to as a built-in diode.

Further, a semiconductor device is commonly known in which directly beneath a first semiconductor region between trenches, a fourth semiconductor region is disposed in contact with the first semiconductor region, whereby a predetermined withstand voltage may be established and maintained; and the fourth semiconductor region is disposed so that between adjacent fourth semiconductor regions, at least two trenches are disposed, whereby cell pitch may be reduced (for example, refer to Japanese Laid-Open Patent Publication No. 2018-19045).

SUMMARY OF THE INVENTION

According to an embodiment, a semiconductor device includes a semiconductor substrate of a first conductivity type, having a first main surface and a second main surface opposite to each other; a first semiconductor layer of the first conductivity type, provided on the first main surface of the semiconductor substrate, the first semiconductor layer having an impurity concentration lower than an impurity concentration of the semiconductor substrate, the first semiconductor layer having a first surface and a second surface opposite to each other, the second surface of the first semiconductor layer facing the semiconductor substrate; a plurality of first base regions of a second conductivity type, selectively provided in the first semiconductor layer, at the first surface of the first semiconductor layer; a plurality of second base regions of the second conductivity type, selectively provided in the first semiconductor layer; a second semiconductor layer of the second conductivity type, provided on the first surface of the first semiconductor layer and having a first surface and a second surface opposite to each other, the second surface of the second semiconductor layer facing the semiconductor substrate; a plurality of first semiconductor regions of the first conductivity type, selectively provided in the second semiconductor layer, at the first surface of the second semiconductor layer; a plurality of second semiconductor regions of the second conductivity type, selectively provided in the second semiconductor layer, at the first surface of the second semiconductor layer, the second semiconductor regions having an impurity concentration higher than an impurity concentration of the second semiconductor layer; a plurality of trenches penetrating through the first semiconductor regions and the second semiconductor layer, and reaching the first semiconductor layer; a plurality of gate electrodes each provided in a respective one of the trenches via a gate insulating film; an interlayer insulating film provided on the gate electrodes; a plurality of first electrodes provided on a surface of the second semiconductor layer and surfaces of the first semiconductor regions; and a second electrode provided on the second main surface of the semiconductor substrate. Between an adjacent two of the first base regions, at least two of the trenches, at least two of the gate electrodes, and at least two of the second base regions are disposed. The at least two of the second base regions disposed between the adjacent two of the first base regions are disposed separate from one another and separate from the first base regions, in a direction in which the trenches are arranged.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
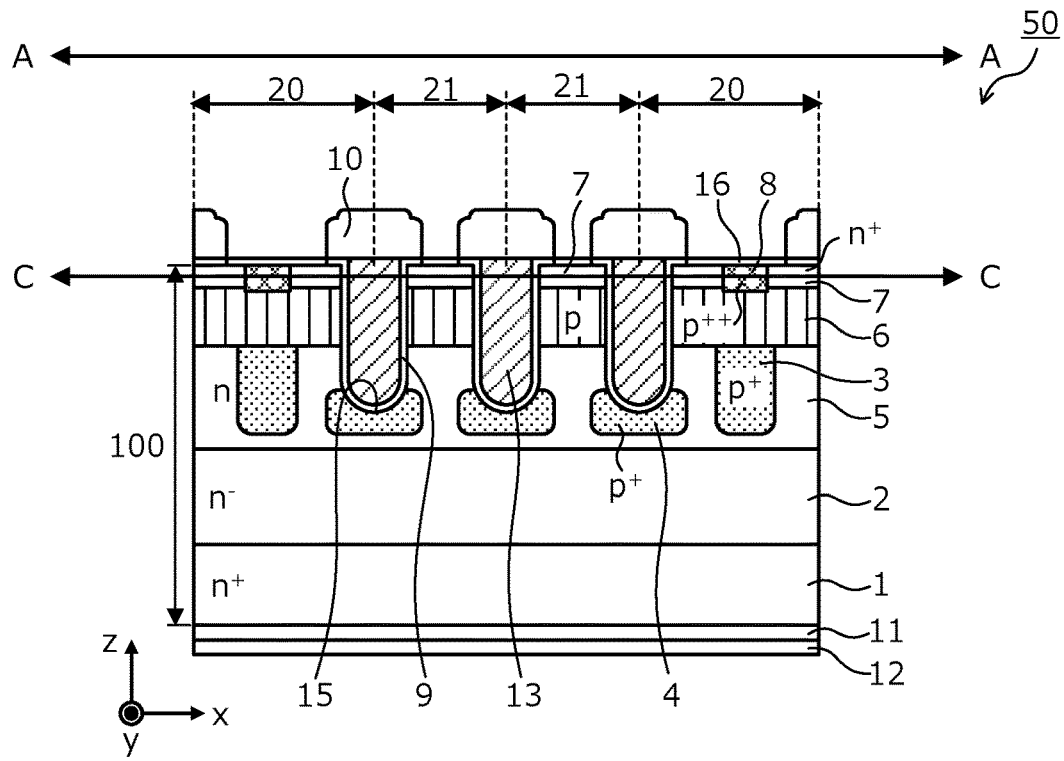
FIG. 1 is a cross-sectional view depicting a structure of a silicon carbide semiconductor device according to an embodiment, along cutting line A-A in FIG. 3.

First, problems associated with the conventional techniques are described. The SiC-MOSFET described in Japanese Laid-Open Patent Publication No. 2018-182032 has a structure in which MOS cells and built-in diode cells are alternately provided. Therefore, when the cell pitch is reduced while maintaining this structure, resistance in a JFET region increases, device element ON resistance increases, and enhancement of the efficiency of power conversion is hindered. Further, in Japanese Laid-Open Patent Publication No. 2018-19045, while a technique of reducing the cell pitch is described, a problem arises in that stability of low current regions degrades.

Embodiments of a semiconductor device according to the present invention will be described in detail with reference to the accompanying drawings. In the present description and accompanying drawings, layers and regions prefixed with n or p mean that majority carriers are electrons or holes, Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 2:
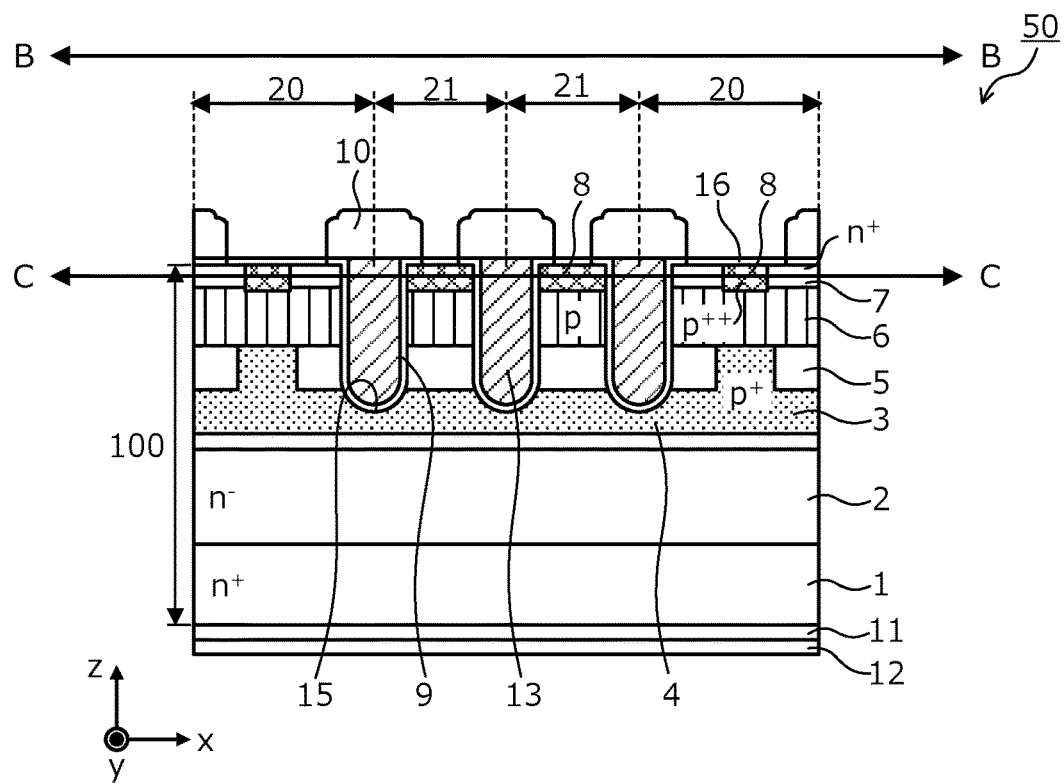
FIG. 2 is a cross-sectional view depicting the structure of the silicon carbide semiconductor device according to the embodiment, along cutting line B-B in FIG. 3.
Figure 3:
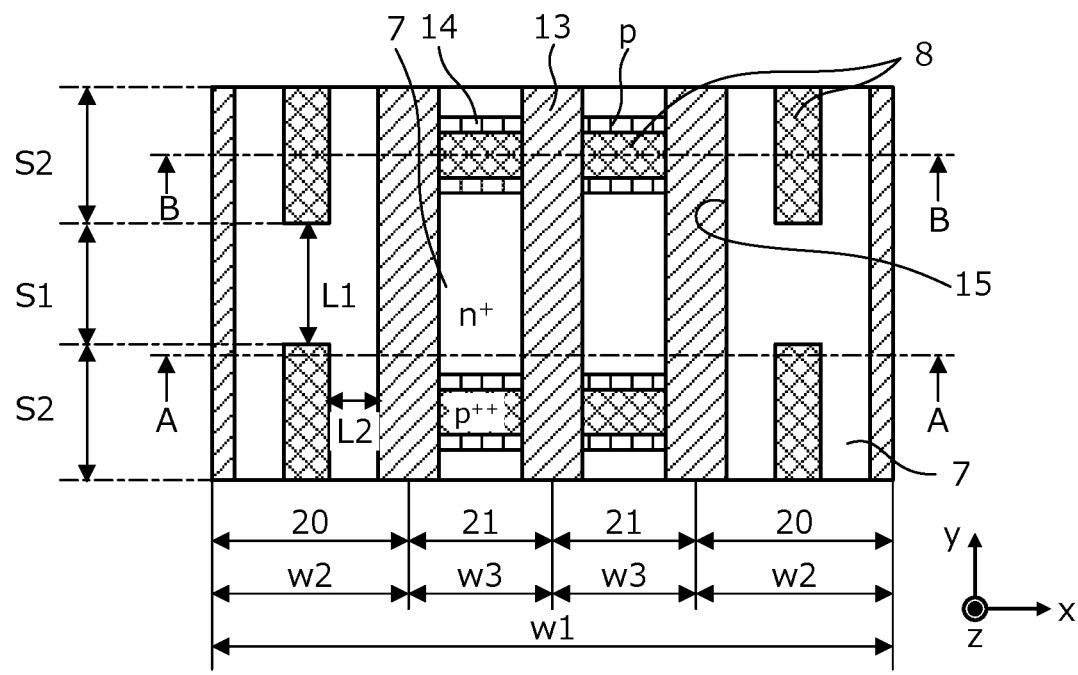
FIG. 3 is a top view depicting the structure of the silicon carbide semiconductor device according to the embodiment, along cutting line C-C in FIGS. 1 and 2.

A semiconductor device according to an embodiment is configured using a semiconductor having a bandgap wider than that of, silicon (Si) (hereinafter, wide bandgap semiconductor). A structure of the semiconductor device according to the embodiment is described taking, as an example, an instance in which, for example, silicon carbide (SiC) is used as the wide bandgap semiconductor. FIG. 1 is a cross-sectional view depicting a structure of a silicon carbide semiconductor device according to the embodiment, along cutting line A-A in FIG. 3. FIG. 2 is a cross-sectional view depicting the structure of the silicon carbide semiconductor device according to the embodiment, along cutting line B-B in FIG. 3. FIG. 3 is a top view depicting the structure of the silicon carbide semiconductor device according to the embodiment, along cutting line C-C in FIGS. 1 and 2.

As depicted in FIGS. 1 and 2, a trench-type MOSFET 50 includes MOS gates of a trench gate structure in a semiconductor base (silicon carbide semiconductor base: semiconductor chip) 100, at a front surface (surface of a later-described p-type base layer 6) of the semiconductor base containing silicon carbide.

An $n^+$-type silicon carbide substrate (semiconductor substrate of a first conductivity type) 1 is a silicon carbide single crystal substrate doped with, for example, nitrogen (N). An $n^-$-type silicon carbide epitaxial layer (first semiconductor layer of the first conductivity type) 2 is a low-concentration n-type drift layer doped with, for example, nitrogen and having an impurity concentration lower than an impurity concentration of the $n^+$-type silicon carbide substrate 1. In the $n^-$-type silicon carbide epitaxial layer 2, at a first surface thereof opposite to a second surface thereof facing the $n^+$-type silicon carbide substrate 1, an n-type high-concentration region 5 may be formed. The n-type high-concentration region 5 is a high-concentration n-type drift layer doped with, for example, nitrogen and having an impurity concentration lower than the impurity concentration of the $n^+$-type silicon carbide substrate 1 and higher than the impurity concentration of the $n^-$-type silicon carbide epitaxial layer 2. Hereinafter, the $n^+$-type silicon carbide substrate 1, the $n^-$-type silicon carbide epitaxial layer 2, and a p-type base layer (second semiconductor layer of a second conductivity type) 6 combined are a silicon carbide semiconductor base 100.

As depicted in FIGS. 1 and 2, on a second main surface (back surface, i.e., back surface of the silicon carbide semiconductor base) of the $n^+$-type silicon carbide substrate 1, a back electrode (second electrode) 11 is provided. The back electrode 11 configures a drain electrode. On a surface of the back electrode 11, a drain electrode 12 is provided.

MOS gates of the trench gate structure are configured by the p-type base layer 6, n$^+$-type source regions (first semiconductor regions of the first conductivity type) 7, p$^{++}$-type contact regions (second semiconductor regions of the second conductivity type) 8, trenches 15, a gate insulating film 9, and gate electrodes 13.

The trench structure is formed in the silicon carbide semiconductor base 100, at a first main surface (surface of the p-type base layer 6) of the silicon carbide semiconductor base 100. In particular, from a first surface (the first main surface of the silicon carbide semiconductor base 100) of the p-type base layer 6 opposite to a second surface thereof facing the n$^+$-type silicon carbide substrate 1, the trenches 15 penetrate through the p-type base layer 6 and reach the n-type high-concentration region 5 (in an instance in which the n-type high-concentration region 5 is not provided, the n$^-$-type silicon carbide epitaxial layer 2, hereinafter, indicated as simply "(2)"). Along inner walls of the trenches 15, the gate insulating film 9 is formed at bottoms and sidewalls of the trenches 15, and the gate electrodes 13 are formed on the gate insulating film 9 in trenches 15. The gate electrodes 13 are insulated from the n$^-$-type silicon carbide epitaxial layer 2 and the p-type base layer 6 by the gate insulating film 9. The gate electrodes 13 may partially protrude toward a source electrode pad (not depicted), from tops of the trenches 15 (end facing the source electrode pad).

In the n$^-$-type silicon carbide epitaxial layer 2, at the first surface thereof opposite to the second surface thereof facing the n$^+$-type silicon carbide substrate 1, first p$^+$-type base regions (first base regions of the second conductivity type) 3 are selectively provided. Further, in the n$^-$-type silicon carbide epitaxial layer 2, second p$^+$-type base regions (second base regions of the second conductivity type) 4 are each selectively provided. The first p$^+$-type base regions 3 are separate from the trenches 15 and reach deep positions closer to the drain electrode 12 than are the bottoms of the trenches 15. A distance from one of the first p$^+$-type base regions 3 to one of the trenches 15 may be preferably determined by, for example, an optimal junction FET (JFET) width with respect to respectively impurity concentrations of the first p$^+$-type base regions 3, the second p$^+$-type base regions 4, and the n-type high-concentration region 5. The JFET width is a width of the JFET region formed between the first p$^+$-type base regions 3 and the second p$^+$-type base regions 4 (distance between one of the first p$^+$-type base regions 3 and one of the second p$^+$-type base regions 4).

The second p$^+$-type base regions 4 are provided at positions facing the bottoms of the trenches 15 in a depth direction z. A width of the second p$^+$-type base regions 4 is equal to or wider than a width of the trenches 15. The bottoms of the trenches 15 may reach the second p$^+$-type base regions 4 or may be positioned in the n-type high-concentration region 5(2), sandwiched between the p-type base layer 6 and the second p$^+$-type base regions 4. The first p$^+$-type base regions 3 and the second p$^+$-type base regions 4, for example, are doped with aluminum (Al).

Portions of the first p$^+$-type base regions 3 may extend toward the trenches 15 to thereby be connected to the second p$^+$-type base regions 4. A reason for this is that holes occurring during avalanche breakdown at joined portions between the second p$^+$-type base regions 4 and the n$^-$-type silicon carbide epitaxial layer 2 are efficiently migrated to the source electrodes 16, whereby load to the gate insulating film 9 is reduced and reliability is increased. In FIG. 1, a structure (first area) in which the first p$^+$-type base regions 3 and the second p$^+$-type base regions 4 are disposed apart from one another is depicted and in FIG. 2, a structure (second area) in which the first p$^+$-type base regions 3 and the second p$^+$-type base regions 4 are connected is depicted.

At the first surface of the n$^-$-type silicon carbide epitaxial layer 2, the p-type base layer 6 is provided. The p-type base layer 6 is in contact with the first p$^+$-type base regions 3. An impurity concentration of the p-type base layer 6, for example, may be lower than the impurity concentration of the first p$^+$-type base regions 3. As a result, a p-type impurity concentration of portions of base regions formed by the first p$^+$-type base regions 3 and the p-type base layer 6 where an n-type inversion layer (channel) is formed in an ON state may be reduced and therefore, increases in gate threshold voltage (Vth) and ON resistance may be prevented. Further, the p-type impurity concentration of drain-side portions (the first p$^+$-type base regions 3) of the base regions may be increased and therefore, a predetermined withstand voltage may be sustained. The n$^+$-type source regions (first semiconductor regions of the first conductivity type) 7 and the p$^{++}$-type contact regions (second semiconductor regions of the second conductivity type) 8 are selectively provided in the p-type base layer 6.

The n-type high-concentration region 5 may be provided in regions sandwiched between the first p$^+$-type base regions 3 and the second p$^+$-type base regions 4 in the n$^-$-type silicon carbide epitaxial layer 2 at the first surface of the n$^-$-type silicon carbide epitaxial layer 2, and in regions between the p-type base layer 6 and the second p$^+$-type base regions 4. The n-type high-concentration region 5 is provided to a position deeper than are the first p$^+$-type base regions 3 and the second p$^+$-type base regions 4. Therefore, a depth of the n-type high-concentration region 5 (thickness) is greater than a depth (thickness) of the first p$^+$-type base regions 3 and a depth (thickness) of the second p$^+$-type base regions 4. Further, the first p$^+$-type base regions 3 and the second p$^+$-type base regions 4 may be provided at positions of a same depth. Further, the n-type high-concentration region 5 may be provided so as to surround the first p$^+$-type base regions 3 and the second p$^+$-type base regions 4 on drain-sides of the first p$^+$-type base regions 3 and the second p$^+$-type base regions 4.

As depicted in FIGS. 1 to 3, unit cells of the trench-type MOSFET 50 according to the embodiment are configured by multiple MOS cells 21 and multiple body diode cells 20 adjacent to the MOS cells 21. In FIGS. 1 to 3, a unit cell is configured by two of the MOS cells 21, and two the body diode cells 20 that are adjacent to the MOS cells 21. The body diode cells 20 are regions having built-in diodes formed by the p$^{++}$-type contact regions 8, the p-type base layer 6, and the n$^-$-type silicon carbide epitaxial layer 2. The MOS cells 21 are regions having MOS gate structures configured by the trenches 15, the gate electrodes 13, and the n$^+$-type source regions 7.

As depicted in FIGS. 1 to 3, in the embodiment, at least two of the MOS cells 21 are disposed between the body diode cells 20. Therefore, in the embodiment, the trenches 15, the gate electrodes 13, and the second p$^+$-type base regions 4 are disposed in plural between adjacent first p$^+$-type base regions 3.

A cell pitch w1 of the unit cells in an x direction is determined by a cell pitch w2 of the body diode cells 20 in the x direction and a cell pitch w3 (in the x direction) of the MOS cells 21 disposed between the body diode cells 20. In an instance in which a quantity n of the MOS cells 21 is disposed between the body diode cells 20, the cell pitch w1 of the unit cells in the x direction=2×w2+(n×w3). The cell pitch w2 of the body diode cells 20 in the x direction is significantly restricted by position accuracy and ion diffusion of ion implantations for the n$^+$-type source regions 7 and the p$^{++}$-type contact regions 8. Assuming the cell pitch w2 of the body diode cells 20 in the x direction is 3.4 μm, the cell pitch w3 of the MOS cells 21 in the x direction is 1.7 μm, and a number of sidewalls of the trenches 15 included in a unit cell is Nch, then Nch=4+2n. A number of the sidewalls of the trenches 15 per unit length in the x direction is (4+2n)/(6.8÷1.7n). In this manner, by increasing the number of the MOS cells 21 disposed between the body diode cells 20, the number of sidewalls of the trenches 15 per unit length may be increased and as a result, channel density increases and ON resistance may be reduced.

Further, as depicted in FIG. 1, the second p$^+$-type base regions 4 disposed between the adjacent first p$^+$-type base regions 3 are disposed apart from one another in a direction in which the trenches 15 are arranged (x-axis direction) and are disposed apart from the first p$^+$-type base regions 3. As a result, when avalanche breakdown occurs in the body diode cells 20, application of high electric field to the gates is prevented and reliability of the gates may be enhanced.

Nonetheless, in first regions in which the n$^+$-type source regions 7 are provided between the trenches 15 (refer to FIG. 1), while the second p$^+$-type base regions 4 are disposed apart from one another and apart from the first p$^+$-type base regions 3 in the direction in which the trenches 15 are arranged, in second regions in which the p$^{++}$-type contact regions 8 are provided between the trenches 15, not the n$^+$-type source regions 7 (refer to FIG. 2), the second p$^+$-type base regions 4 may be disposed in contact with one another and in contact with the first p$^+$-type base regions 3 in the direction in which the trenches 15 are arranged. In regions in which the n$^+$-type source regions 7 are not provided, current does not flow in a channel and therefore, when avalanche breakdown occurs in the body diode cells 20, there is no application of high electric field to the gates.

Further, as depicted in FIG. 3, when a cross-section of the trench-type MOSFET 50 along cutting line C-C is viewed from the front surface, the p$^{++}$-type contact regions 8 are provided having an island-like shape. The p$^{++}$-type contact regions 8 provided in the body diode cells 20, i.e., the p$^{++}$-type contact regions 8 disposed above the first p$^+$-type base regions 3 are disposed separate from the trenches 15. Further, the p$^{++}$-type contact regions 8 provided in the MOS cells 21, i.e., the p$^{++}$-type contact regions 8 disposed on regions between the trenches 15 adjacent to one another without the first p$^+$-type base regions 3 intervening therebetween, at least partially contact the trenches 15.

The p$^{++}$-type contact regions 8 are not provided in the MOS cells 21 in the x direction of regions S1 in which the p$^{++}$-type contact regions 8 are not provided in the body diode cells 20, and the p$^{++}$-type contact regions 8 are partially provided in the MOS cells 21 in the x direction of regions S2 in which the p$^{++}$-type contact regions 8 are provided in the body diode cells 20. Therefore, when a length L1 of the regions S1 is long, the area of the p$^{++}$-type contact regions 8 in the MOS cells 21 decreases and contact resistance increases. Further, when the length L1 of the regions S1 is short, the area of the p$^{++}$-type contact regions 8 in the MOS cells 21 increases, the channel density decreases, and the ON resistance increases. Therefore, the length L1 of the regions S1 may be preferably in a range from 3 μm to 5 μm. Further, in the regions S2, a distance L2 between one of the p$^{++}$-type contact regions 8 and one of the trenches 15 adjacent thereto is determined by processing and may be preferably in a range greater than 0 μm to at most 1 μm.

Further, as depicted in FIG. 3, when a cross-section of the trench-type MOSFET 50 along cutting line C-C is viewed from the front surface, the n$^+$-type source regions 7 are disposed in an island-like shape. The n$^+$-type source regions 7 provided in the body diode cells 20, i.e., the n$^+$-type source regions 7 disposed above the first p$^+$-type base regions 3 are disposed in contact with the trenches 15. Further, the n$^+$-type source regions 7 provided in the MOS cells 21, i.e., the n$^+$-type source regions 7 disposed on regions between the trenches 15 adjacent to one another without the first p$^+$-type base regions 3 intervening therebetween, are at least partially in contact with the trenches 15.

As described hereinafter, the n$^+$-type source regions 7 and the p$^{++}$-type contact regions 8 are formed by ion implantation. Therefore, between the n$^+$-type source regions 7 and the p$^{++}$-type contact regions 8, regions where the n$^+$-type source regions 7 and the p$^{++}$-type contact regions 8 overlap one another (not depicted) are formed. In the embodiment, these regions of the MOS cells 21, i.e., the regions where the p$^{++}$-type contact regions 8 and the n$^+$-type source regions 7 disposed on the regions between the trenches 15 adjacent to one another without the first p$^+$-type base regions 3 intervening therebetween, overlap one another, are disposed separate from the trenches 15.

Further, in the MOS cells 21, the n$^+$-type source regions 7 and the p$^{++}$-type contact regions 8 are formed apart from one another, and between the n$^+$-type source regions 7 and the p$^{++}$-type contact regions 8, p-type contact regions (third semiconductor regions of the second conductivity type) 14 or n-type contact regions (not depicted, third semiconductor regions of the first conductivity type) may be provided. The p-type contact regions 14 are regions where the p-type base layer 6 is exposed on the front surface or regions having an impurity concentration lower than an impurity concentration of the p$^{++}$-type contact regions 8 and higher than the impurity concentration of the p-type base layer 6. The n-type contact regions are regions having an impurity concentration lower than an impurity concentration of the n$^+$-type source regions 7. As a result, regions where the n$^+$-type source regions 7 and the p$^{++}$-type contact regions 8 overlap one another are prevented from being in contact with the trenches 15 and reliability of the gates may be enhanced.

Further, the impurity concentration of the p-type contact regions 14 is set to be lower than the impurity concentration of the p$^{++}$-type contact regions 8 and the impurity concentration of the n-type contact regions is set to be lower than the impurity concentration of the n$^+$-type source regions 7, whereby a waveform of the gates may be stabilized.

An interlayer insulating film 10 is provided in an entire area of the front surface of the semiconductor substrate so as to cover the gate electrodes 13. In the interlayer insulating film 10, contact holes penetrating through the interlayer insulating film 10 in the depth direction z and reaching the substrate front surface are opened.

The source electrodes (first electrodes) 16, in the contact holes, are in ohmic contact with the semiconductor substrate (the n$^+$-type source regions 7 and the p$^{++}$-type contact regions 8) and are electrically insulated from the gate electrodes 13 by the interlayer insulating film 10. On the source electrodes 16, the source electrode pad (not depicted) is provided.

In FIGS. 1 to 3, only a structure of a unit cell in which two of the MOS cells 21 are disposed between two of the body diode cells 20 is depicted. In this instance, to dispose more unit cells in parallel, outside the body diode cells 20, the MOS cells 21 and another one of the body diode cells 20 are each sequentially provided. In other words, the MOS cells 21 and the body diode cells 20 suffice to be provided to alternate each other. Here, between the body diode cells 20, three or more of the MOS cells 21 may be disposed. Further, two or more of the body diode cells 20 may be successively disposed provided the body diode cells 20 are fewer in number than the MOS cells 21. For example, two of the body diode cells 20, three of the MOS cells 21, and two of the body diode cells 20 may be arranged and disposed.

Next, a method of manufacturing the silicon carbide semiconductor device according to the embodiment is described. FIGS. 4, 5A, 5B, 6A, 6B, 7A, and 7B are cross-sectional views depicting states of the silicon carbide semiconductor device according to the embodiment during manufacture.

Figure 4:
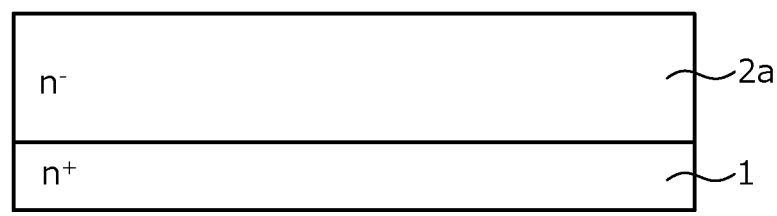
FIG. 4 is a cross-sectional view depicting a state of the silicon carbide semiconductor device according to the embodiment during manufacture.

First, the $n^+$-type silicon carbide substrate 1 containing silicon carbide of an n-type is prepared. Subsequently, on the first main surface of the $n^+$-type silicon carbide substrate 1, a lower $n^-$-type silicon carbide epitaxial layer 2a is epitaxially grown to a thickness of, for example, about 30 μm while an n-type impurity, for example, nitrogen atoms (N) is doped. The state up to here is depicted in FIG. 4.

Next, on a surface of the lower $n^-$-type silicon carbide epitaxial layer 2a, an ion implantation mask having predetermined openings is formed by a photolithographic technique using, for example, an oxide film. Subsequently, a p-type impurity such as aluminum is implanted into the openings of the oxide film, thereby forming lower first $p^+$-type base regions 3a and the second $p^+$-type base regions 4 of a depth of about 0.5 μm.

Figure 5A:
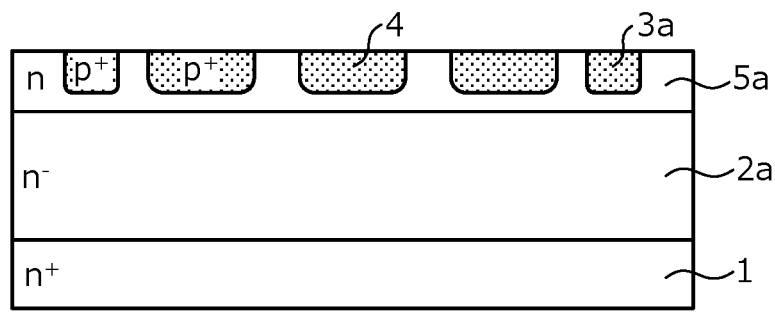
FIG. 5A is a cross-sectional view depicting a state of the silicon carbide semiconductor device according to the embodiment during manufacture.
Figure 5B:
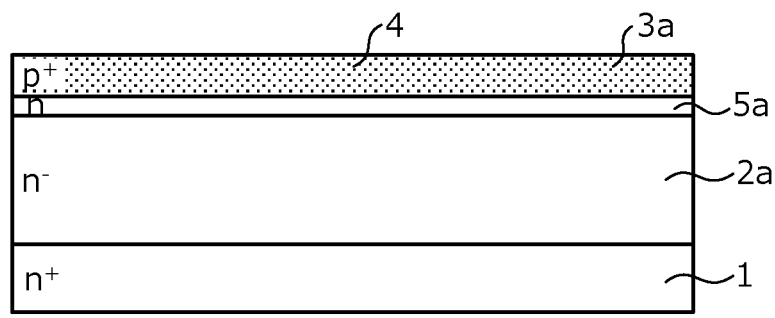
FIG. 5B is a cross-sectional view depicting a state of the silicon carbide semiconductor device according to the embodiment during manufacture.

Next, the ion implantation mask may be partially removed, an n-type impurity such as nitrogen may be ion implanted into an opening, and in a portion of a surface region of the lower $n^-$-type silicon carbide epitaxial layer 2a, a lower n-type high-concentration region 5a may be formed, for example, at a depth of about 0.5 μm. An impurity concentration of the lower n-type high-concentration region 5a is set to, for example, about $1\times10^{17}/cm^3$. The state up to here is depicted in FIGS. 5A and 5B. FIG. 5A depicts a state of a portion corresponding to cutting line A-A in FIG. 3 during manufacture and FIG. 5B depicts a state of a portion corresponding to cutting line B-B in FIG. 3 during manufacture.

Next, on a surface of the lower $n^-$-type silicon carbide epitaxial layer 2a, an upper $n^-$-type silicon carbide epitaxial layer 2b doped with an n-type impurity such as nitrogen and having a thickness of about 0.5 μm is formed. An impurity concentration of the upper $n^-$-type silicon carbide epitaxial layer 2b is set to be about $3\times10^{15}/cm^3$. Hereinafter, the lower $n^-$-type silicon carbide epitaxial layer 2a and the upper $n^-$-type silicon carbide epitaxial layer 2b combined are the $n^-$-type silicon carbide epitaxial layer 2.

Next, on a surface of the upper $n^-$-type silicon carbide epitaxial layer 2b, an ion implantation mask having predetermined openings is formed by photolithography using, for example, an oxide film. Subsequently, a p-type impurity such as aluminum is implanted into the openings of the oxide film, thereby forming upper first $p^+$-type base regions 3b of a depth of about 0.5 μm so as to overlap the lower first $p^+$-type base regions 3a. The upper first $p^+$-type base regions 3b and the lower first $p^+$-type base regions 3a form continuous regions that are the first $p^+$-type base regions 3. An impurity concentration of the upper first $p^+$-type base regions 3b is set to be, for example, about $5\times10^{18}/cm^3$.

Next, the ion implantation mask may be partially removed, an n-type impurity such as nitrogen may be ion implanted into the openings, and upper n-type high-concentration regions 5b of a depth of, for example, about 0.5 μm may be formed in a portion of a surface region of the $n^-$-type silicon carbide epitaxial layer 2. An impurity concentration of the upper n-type high-concentration regions 5b is set to be, for example, about $1\times10^{17}/cm^3$. The upper n-type high-concentration regions 5b and the lower n-type high-concentration region 5a are formed to at least partially contact one another and form the n-type high-concentration region 5. Nonetheless, the n-type high-concentration region 5 may be formed in an entire area of the substrate or may be omitted.

Next, on a surface of the $n^-$-type silicon carbide epitaxial layer 2, the p-type base layer 6 of a thickness of about 1.1 μm is formed by epitaxial growth. An impurity concentration of the p-type base layer 6 is set to be $4\times10^{17}/cm^3$. After the p-type base layer 6 is formed by epitaxial growth, the p-type base layer 6 may be further implanted with a p-type impurity such as aluminum.

Next, in a first main surface layer (surface layer of the p-type base layer 6) of the silicon carbide semiconductor base 100, predetermined regions configuring the MOS gates are formed. In particular, on a surface of the p-type base layer 6, an ion implantation mask having predetermined openings is formed by photolithography using, for example, an oxide film. In these openings, an n-type impurity such as nitrogen (N) or phosphorus (P) is ion implanted, thereby forming the $n^+$-type source regions 7 in portions of the p-type base layer 6, at the surface of the p-type base layer 6. Next, the ion implantation mask used in forming the $n^+$-type source regions 7 is removed and by a similar method, an ion implantation mask having predetermined openings may be formed, a p-type impurity such as boron (B) may be ion implanted in portions of the p-type base layer 6 at a surface of the p-type base layer 6, and the $p^{++}$-type contact regions 8 may be formed. The impurity concentration of the $p^{++}$-type contact regions 8 is set to be higher than the impurity concentration of the p-type base layer 6.

Further, in the MOS cells 21, the $n^+$-type source regions 7 and the $p^{++}$-type contact regions 8 are formed separate from one another and on the front surface, the p-type contact regions 14 where the p-type base layer 6 is exposed, the p-type contact regions 14 of an impurity concentration lower than the impurity concentration of the $p^{++}$-type contact regions 8 and higher than the impurity concentration of the p-type base layer 6, or the n-type contact regions (not depicted) of an impurity concentration lower than the impurity concentration of the $n^+$-type source regions 7 may be formed.

Figure 6A:
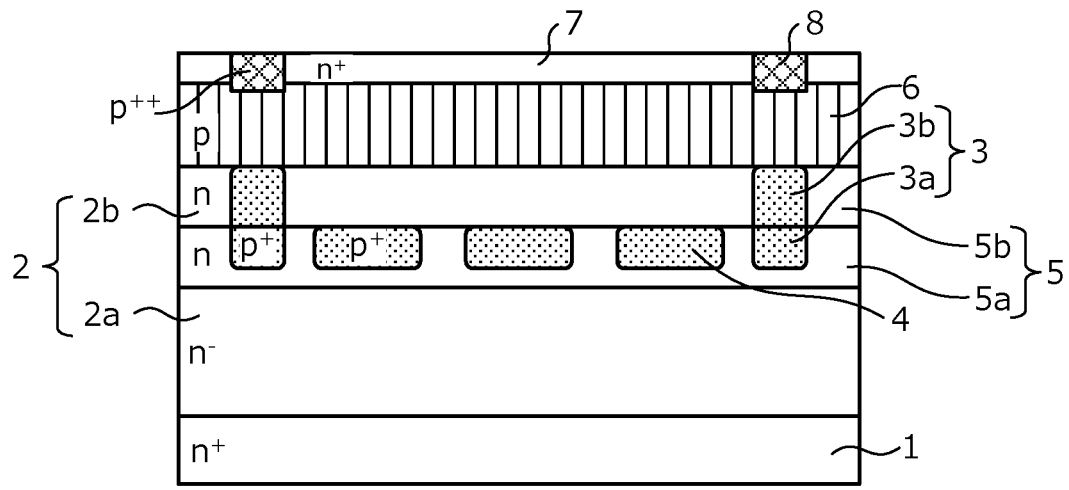
FIG. 6A is a cross-sectional view depicting a state of the silicon carbide semiconductor device according to the embodiment during manufacture.
Figure 6B:
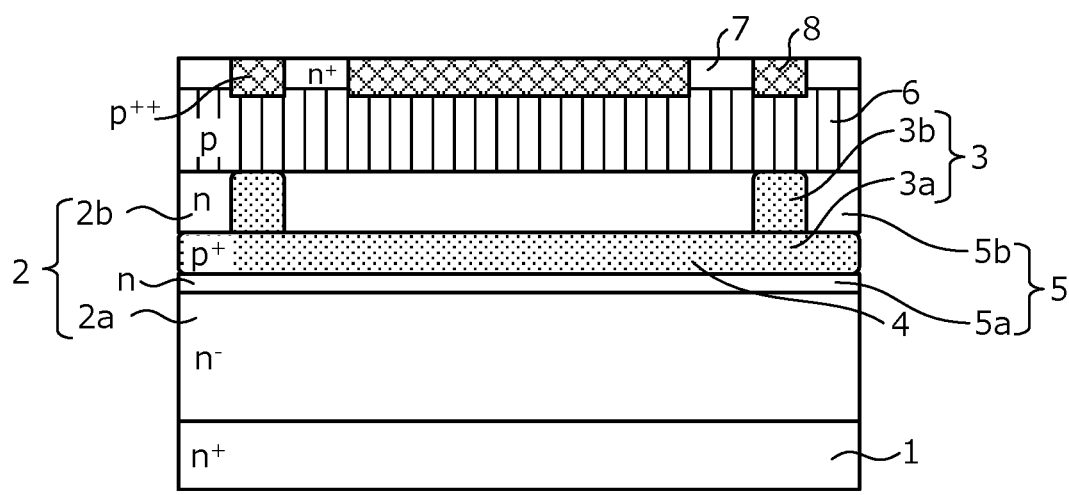
FIG. 6B is a cross-sectional view depicting a state of the silicon carbide semiconductor device according to the embodiment during manufacture.

Next, a heat treatment (activation annealing) for activating all regions formed by ion implantation is performed. For example, a heat treatment (annealing) under an inert gas atmosphere of a temperature of 1700 degrees C. is performed, whereby an activation process for the first $p^+$-type base regions 3, the second $p^+$-type base regions 4, the $n^+$-type source regions 7 and the $p^{++}$-type contact regions 8, the p-type contact regions 14 and the n-type contact regions is implemented. As described above, the ion implanted regions may be collectively activated by a single session of the heat treatment or may be activated by performing the heat treatment each time ion implantation is performed. The state up to here is depicted in FIGS. 6A and 6B. FIG. 6A depicts a state of the portion corresponding to cutting line A-A in FIG. 3 during manufacture and FIG. 6B depicts a state of the portion corresponding to cutting line B-B in FIG. 3 during manufacture.

Next, on a surface of the p-type base layer 6, a trench formation mask having predetermined openings is formed by photolithography using, for example, an oxide mask. Next, the trenches 15 that penetrate through the p-type base layer 6 and reach the n-type high-concentration region 5(2) are formed by dry etching. The bottoms of the trenches 15 may reach the second $p^+$-type base regions 4 formed in the n-type high-concentration region 5(2). Next, the trench formation mask is removed.

Next, the gate insulating film 9 is formed along surfaces of the $n^+$-type source regions 7, surfaces of the $p^{++}$-type contact regions 8, and the bottoms and sidewalls of the trenches 15. The gate insulating film 9 may be formed by thermal oxidation of a temperature of about 1000 degrees C. under an oxygen atmosphere. Further, the gate insulating film 9 may be formed by a deposition method by a chemical reaction such as that for a high temperature oxide (HTO).

Figure 7A:
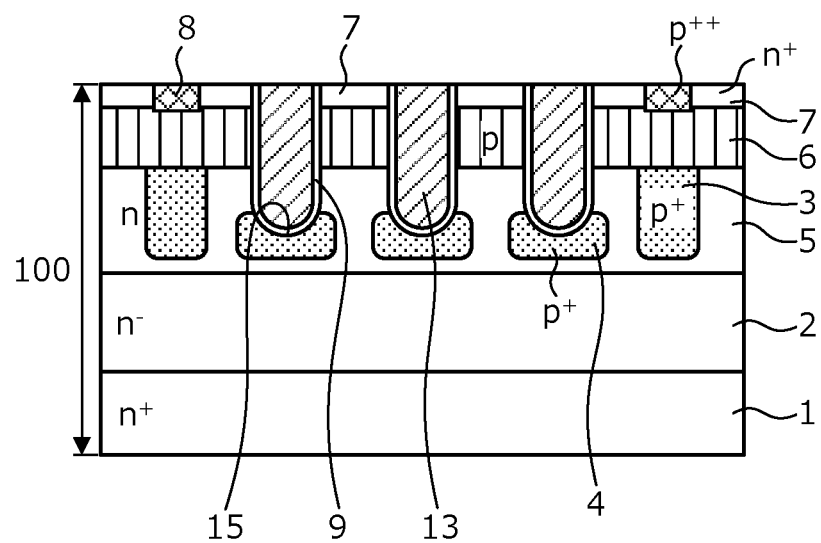
FIG. 7A is a cross-sectional view depicting a state of the silicon carbide semiconductor device according to the embodiment during manufacture.
Figure 7B:
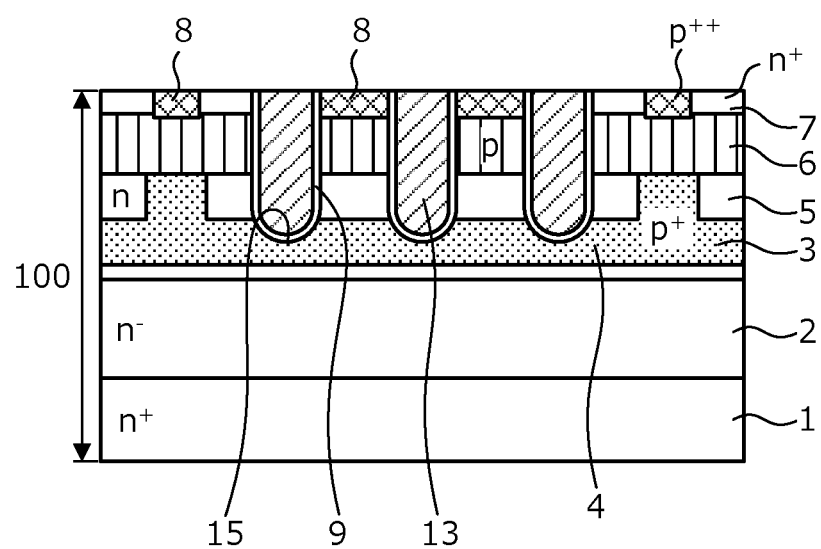
FIG. 7B is a cross-sectional view depicting a state of the silicon carbide semiconductor device according to the embodiment during manufacture.
Figure 8:
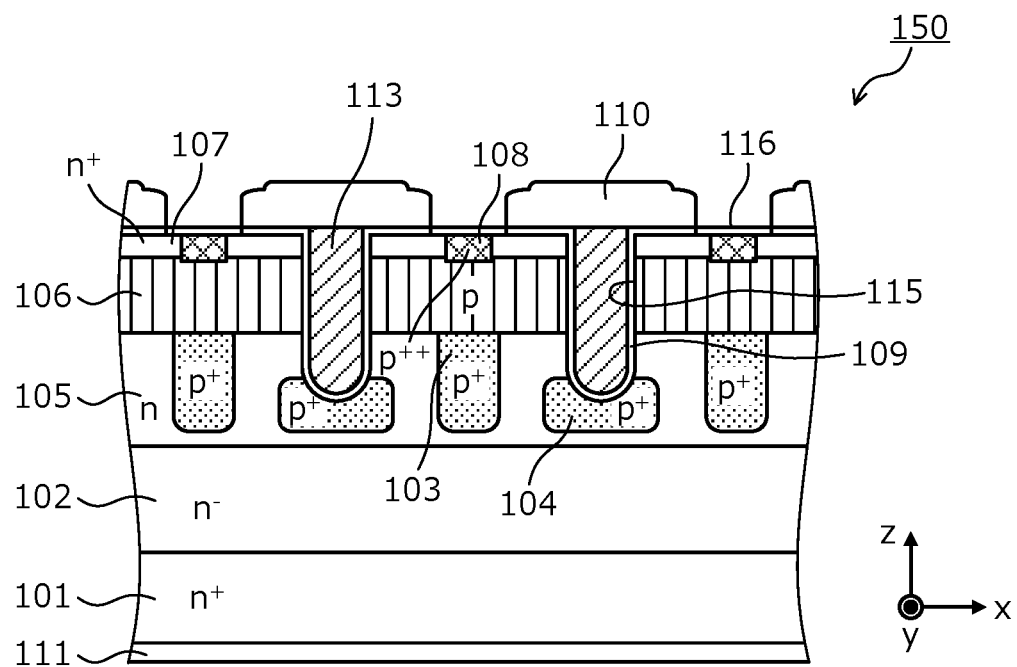
FIG. 8 is a cross-sectional view depicting a structure of a conventional silicon carbide semiconductor device.

Next, on the gate insulating film 9, a polycrystalline silicon layer doped with, for example, phosphorus atoms is provided. The polycrystalline silicon layer may be formed so as to be embedded in the trenches 15. The polycrystalline silicon layer is patterned by photolithography and left in the trenches 15, whereby the gate electrodes 13 are formed. The state up to here is depicted in FIGS. 7A and 7B. FIG. 7A depicts a state of the portion corresponding to cutting line A-A in FIG. 3 during manufacture and FIG. 7B depicts a state of the portion corresponding to cutting line B-B in FIG. 3 during manufacture.

Next, for example, phosphate glass is deposited having a thickness of about 1 μm so as to cover the gate insulating film 9 and the gate electrodes 13, thereby forming the interlayer insulating film 10. Next, a barrier metal (not depicted) containing titanium (Ti) or titanium nitride (TiN) may be formed so as to cover the interlayer insulating film 10. The interlayer insulating film 10 and the gate insulating film 9 are patterned by photolithography, and contact holes exposing the $n^+$-type source regions 7 and the $p^{++}$-type contact regions 8 are formed. Thereafter, a heat treatment (reflow) is performed, planarizing the interlayer insulating film 10.

Next, the interlayer insulating film 10 is selectively removed, and a nickel (Ni) or Ti film is deposited on a surface of the silicon carbide semiconductor base 100. Next, a surface is protected, and a Ni or Ti film is deposited on a back side of the $n^+$-type silicon carbide substrate 1. Next, a heat treatment of about 1000 degrees C. is performed and ohmic electrodes are formed on a surface side of the silicon carbide semiconductor base 100 and on a surface side of the back surface of the $n^+$-type silicon carbide substrate 1.

Next, a conductive film that forms the source electrodes 16 is provided on the interlayer insulating film 10 so as to be in contact with ohmic electrode portions formed in the contact holes, thereby contacting the $n^+$-type source regions 7 and the $p^{++}$-type contact regions 8 with the source electrodes 16.

Next, on the second main surface of the $n^+$-type silicon carbide substrate 1, for example, the back electrode 11 is formed by a nickel (Ni) film. Thereafter, a heat treatment is performed at a temperature of, for example, about 970 degrees C., whereby the $n^+$-type silicon carbide substrate 1 and the back electrode 11 are in ohmic contact with each other.

Next, for example, by a sputtering technique, on the source electrodes 16 of the front surface of the silicon carbide semiconductor base 100 and in the openings of the interlayer insulating film 10, an electrode pad that forms the source electrode pad (not depicted) is deposited. A thickness of portions of the electrode pad on the interlayer insulating film 10 may be, for example, 5 μm. The electrode pad may be formed by aluminum (Al—Si) containing silicon at a rate of, for example, 1%. Next, the source electrode pad is selectively removed.

Next, on a surface of the back electrode 11, for example, titanium (Ti), nickel (Ni), and gold (Au) are sequentially deposited as the drain electrode 12. In this manner, the silicon carbide semiconductor device depicted in FIGS. 1 to 3 is completed.

As described above, according to the silicon carbide semiconductor device according to the embodiment, between the body diode cells, at least two of the MOS cells are disposed. Thus, by increasing the number of MOS cells disposed between the body diode cells, the number of sidewalls of the trenches per unit length may be increased and as a result, channel density increases and the ON resistance may be reduced.

Further, the second $p^+$-type base regions disposed between adjacent first $p^+$-type base regions are disposed apart from one another. As a result, when avalanche breakdown occurs at the body diode cells, application of high electric field to the gates is prevented and the reliability of the gates may be enhanced.

In the foregoing, the present invention may be variously modified within a range not departing from the spirit of the invention and in the embodiments described above, for example, dimensions, impurity concentrations, and the like of parts, etc. are variously set according to necessary specifications. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, between the body diode cells, at least two of the MOS cells are disposed. Thus, by increasing the number of MOS cells disposed between the body diode cells, the number of sidewalls of the trenches per unit length may be increased and as a result, the channel density increases and the ON resistance may be reduced.

Further, the second $p^+$-type base regions (second base regions of the second conductivity type) disposed between the adjacent first $p^+$-type base regions (first base regions of the second conductivity type) are disposed apart from one another. As a result, when avalanche breakdown occurs at the body diode cells, application of high electric field to the gates is prevented and reliability of the gates may be enhanced.

The semiconductor device according to the present invention achieves an effect in that by reducing the cell pitch without increasing resistance in the JFET region, the ON resistance is reduced while efficiency and reliability are high.

As described above, the semiconductor device according to the present invention is useful for high-voltage power semiconductor devices used in power converting equipment such as inverters, power source devices such as in various types of industrial machines, automobile igniters, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate of a first conductivity type, having a first main surface and a second main surface opposite to each other;
a first semiconductor layer of the first conductivity type, provided on the first main surface of the semiconductor substrate, the first semiconductor layer having an impurity concentration lower than an impurity concentration of the semiconductor substrate, the first semiconductor layer having a first surface and a second surface opposite to each other, the second surface of the first semiconductor layer facing the semiconductor substrate;
a plurality of first base regions of a second conductivity type, selectively provided in the first semiconductor layer, at the first surface of the first semiconductor layer;
a plurality of second base regions of the second conductivity type, selectively provided in the first semiconductor layer;
a second semiconductor layer of the second conductivity type, provided on the first surface of the first semiconductor layer and having a first surface and a second surface opposite to each other, the second surface of the second semiconductor layer facing the semiconductor substrate;
a plurality of first semiconductor regions of the first conductivity type, selectively provided in the second semiconductor layer, at the first surface of the second semiconductor layer;
a plurality of second semiconductor regions of the second conductivity type, selectively provided in the second semiconductor layer, at the first surface of the second semiconductor layer, the plurality of second semiconductor regions having an impurity concentration higher than an impurity concentration of the second semiconductor layer;
a plurality of trenches penetrating through the plurality of first semiconductor regions and the second semiconductor layer, and reaching the first semiconductor layer, each of the plurality of second base regions being provided below a corresponding one of the plurality of trenches;
a plurality of gate electrodes each provided in a respective one of the plurality of trenches via a gate insulating film;
an interlayer insulating film provided on the plurality of gate electrodes;
a plurality of first electrodes provided on a surface of the second semiconductor layer and surfaces of the plurality of first semiconductor regions; and
a second electrode provided on the second main surface of the semiconductor substrate, wherein
at least two of the plurality of trenches, at least two of the plurality of gate electrodes and at least two of the plurality of second base regions are disposed between an adjacent two of the plurality of first base regions that are adjacent to each other without any others among the plurality of first base regions intervening therebetween, and
the at least two of the plurality of second base regions disposed between the adjacent two of the plurality of first base regions are disposed separate from one another and separate from the plurality of first base regions in a direction in which the plurality of trenches are arranged.

2. The semiconductor device according to claim 1, wherein
the at least two of the plurality of second base regions disposed between the adjacent two of the plurality of first base regions are disposed in a first area, the first area having a second area in which an adjacent two of the plurality of trenches that are adjacent to each other are provided, the second area including a first region in which at least two of the plurality of first semiconductor regions are provided and a second region in which at least two of the plurality of second semiconductor regions are provided,
in the first region, the at least two of the plurality of second base regions are disposed separate from one another and separate from the plurality of first base regions in the direction in which the plurality of trenches are arranged, and
in the second region, the at least two of the plurality of second base regions are disposed in contact with one another and in contact with the plurality of first base regions in the direction in which the plurality of trenches are arranged.

3. The semiconductor device according to claim 1, wherein
the plurality of second semiconductor regions are each disposed in an island-like shape in a plan view from the first main surface,
among the plurality of second semiconductor regions, ones each disposed above the plurality of first base regions are each separate from the plurality of trenches, and
among the plurality of second semiconductor regions, other ones disposed on respective regions between an adjacent two of the plurality of trenches that are adjacent to each other without any others among the plurality of first base regions intervening therebetween, at least partially contact the adjacent two of the plurality of trenches.

4. The semiconductor device according to claim 1, wherein
the plurality of first semiconductor regions are each disposed in an island-like shape in a plan view from the first main surface,
among the plurality of first semiconductor regions, ones disposed above the plurality of first base regions are in contact with the plurality of trenches, and
among the plurality of first semiconductor regions, other ones each disposed on regions between an adjacent two of the plurality of trenches that are adjacent to each other without any others among the plurality of first base regions intervening therebetween, at least partially contact the adjacent two of the plurality of trenches.

5. The semiconductor device according to claim 1, wherein
in a plan view from the first main surface, an interface of one of the plurality of second semiconductor regions and one of the plurality of first semiconductor regions, which are disposed in a region between an adjacent two of the plurality of trenches that are adjacent to each other without any others among the plurality of first base regions intervening therebetween, is located away from the adjacent two of the trenches.

6. The semiconductor device according to claim 1, further comprising
a plurality of third semiconductor regions of the first conductivity type or the second conductivity type, selectively provided in the second semiconductor layer, at the first surface of the second semiconductor layer, the plurality of third semiconductor regions, in a plan view from the first main surface, being each disposed between a respective one of the plurality of second semiconductor regions and a respective one of the plurality of first semiconductor regions disposed on a respective one of regions between an adjacent two of the plurality of trenches that are adjacent to each other without any others among the plurality of first base regions intervening therebetween.

7. The semiconductor device according to claim 6, wherein a semiconductor of the semiconductor substrate, the first semiconductor layer, the second semiconductor layer, the plurality of first semiconductor regions, the plurality of second semiconductor regions, and the plurality of third semiconductor regions are silicon carbide.

\* \* \* \* \*